(12) United States Patent
Akram

(10) Patent No.: US 7,141,994 B2
(45) Date of Patent: Nov. 28, 2006

(54) AIR SOCKET FOR TESTING INTEGRATED CIRCUITS

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 95 days.

(21) Appl. No.: 10/766,371

(22) Filed: Jan. 27, 2004

(65) Prior Publication Data

US 2004/0183557 A1   Sep. 23, 2004

Related U.S. Application Data

(62) Division of application No. 09/653,111, filed on Aug. 31, 2000, now Pat. No. 6,690,184.

(51) Int. Cl.
*G01R 1/073* (2006.01)

(52) U.S. Cl. .................................. 324/754; 324/765

(58) Field of Classification Search ................ 324/754, 324/757, 758, 760, 765
See application file for complete search history.

(56) References Cited

U.S. PATENT DOCUMENTS

| | | | |
|---|---|---|---|
| 3,405,361 A | 10/1968 | Kattner et al. | |
| 4,636,723 A | 1/1987 | Coffin | |
| 4,649,339 A | 3/1987 | Grangroth et al. | |
| 4,782,289 A | 11/1988 | Schwar et al. | |
| 4,829,241 A | 5/1989 | Maelzer | |
| 4,922,192 A | 5/1990 | Gross et al. | |
| 5,001,422 A | 3/1991 | Dahlberg et al. | |
| 5,012,187 A | 4/1991 | Littlebury | |
| 5,014,161 A * | 5/1991 | Lee et al. | 361/709 |
| 5,189,363 A | 2/1993 | Bregman et al. | |
| 5,245,277 A | 9/1993 | Nguyen | |
| 5,252,916 A * | 10/1993 | Swart | 324/757 |
| 5,384,531 A | 1/1995 | Yamazaki et al. | |
| 5,389,885 A | 2/1995 | Swart | |
| 5,440,231 A | 8/1995 | Sugai | |
| 5,485,096 A | 1/1996 | Aksu | |
| 5,623,214 A * | 4/1997 | Pasiecznik, Jr. | 324/754 |
| 5,642,054 A * | 6/1997 | Pasiecznik, Jr. | 324/754 |
| 5,647,756 A | 7/1997 | Twigg et al. | |
| 5,654,127 A | 8/1997 | Leedy | |
| 5,656,943 A | 8/1997 | Montoya et al. | |
| 5,788,526 A | 8/1998 | Twigg et al. | |
| 5,831,444 A | 11/1998 | Pai | |
| 5,977,784 A | 11/1999 | Pai | |
| 6,005,401 A | 12/1999 | Nakata et al. | |
| 6,028,437 A * | 2/2000 | Potter | 324/757 |
| 6,033,235 A | 3/2000 | Ikeya | |
| 6,259,263 B1 | 7/2001 | Lawrence et al. | |
| 6,690,184 B1 | 2/2004 | Akram | |
| 6,717,422 B1 | 4/2004 | Akram | |
| 6,791,171 B1 | 9/2004 | Mok et al. | |

\* cited by examiner

*Primary Examiner*—Ernest Karlsen
(74) *Attorney, Agent, or Firm*—Knobbe, Martens, Olson & Bear LLP

(57) ABSTRACT

An electrical component testing device comprising a housing having at least one recess covered by a flexible membrane so as to form a chamber. A fluid passage extends through a portion of the housing and connects to the chamber thus permitting passage of a fluid material into the chamber. At least one contact member is positioned on the flexible membrane so as to provide an electrical connection to an electrical contact on a device to be tested.

16 Claims, 12 Drawing Sheets

AIR SOCKET FOR TESTING INTEGRATED CIRCUITS

REFERENCE TO RELATED APPLICATION

The present application is a division of and claims the priority benefit under 35 U.S.C. §119(e) to U.S. Ser. No. 09/653,111, filed Aug. 31, 2000, now U.S. Pat. No. 6,690,184.

BACKGROUND OF THE INVENTION

1. Field of the Invention

The invention relates to the testing of semiconductor devices. More specifically, the invention relates to a method and apparatus for improving the electrical connections during a testing sequence.

2. Description of the Related Art

Flip-chip and bumped die technology is well known in the art. A flip-chip or bumped die is a semiconductor chip having contact bumps, typically in the form of spherical solder balls or controlled collapse chip connector (C4s) balls, which are electrically connected to the I/O contacts, or contact pads, formed on the active circuit or front side thereof. The I/O contacts provide signal, power, and ground contacts for the chip. The contact bumps are used as electrical and mechanical connectors between the contact pads on the flip-chip and a substrate such as a chip carrier, printed circuit board, or other surface mount device. In some cases the bond pads may be located too close to one another to allow the placement of contact bumps directly on each bond pad without unintentionally electrically connecting every contact bump together. One common solution to this problem is to create a Ball Grid Array (BGA) using commonly known passivation and tracing techniques to place the contact bumps away from the bond pads, yet still retain the electrical connection between the contact bumps and the bond pads.

Another common semiconductor configuration is the board-on-chip (BOC), which comprises a chip permanently attached to a circuit board. In contrast to a flip-chip, the inactive circuit or backside of the chip is attached to the circuit board. The exposed bond pads on the side away from the circuit board are connected to the circuit board with the use of curved wire bonds. A glob top protective resin is subsequently applied over the chip and wire bonds. The contact bumps, which allow further connection to an electrical device or substrate, are then attached directly to the circuit board rather than the chip.

Several materials are typically used to form the contact bumps on the die or the board, such as, for example, conductive polymers, conductive resins, and solder (e.g. alloys of lead and tin). The specific constituents of solder, if used, are dependent on the desired melting temperature as well as the thermal characteristics of the mating surfaces. When the device is permanently attached, the contact bumps are reflowed to form a solder joint between the flip-chip and the substrate, forming both electrical and mechanical connections between the flip-chip and substrate. Due to the presence of the contact bumps on the flip-chip, a standoff exists between the substrate to which the flip-chip is attached or bonded and the bottom surface of the flip-chip.

Before the flip-chip is permanently attached to a substrate, it is typically tested to ensure proper performance. The flip-chip is commonly tested by temporarily connecting it to a socket made of a rigid non-conductive material by which multiple contact members are attached. The use of a non-conductive material prevents interference and allows for electrical isolation of each contact bump of the flip-chip. The electrical connection is made by physically laying the flip-chip onto the socket in a manner that lines up the contact bumps of the device with the appropriate contact members of the socket. The contact members of the socket are electrically connected to testing equipment, which provides the flip-chip with the necessary power and input signals to test the functions of the flip-chip.

A subtle problem often associated with the temporary interconnection of electrical components for testing is that the terminals of an electronic component are not co-planar. With the testing of a chip, the test socket's upper surface is generally flat to allow for the temporary connection between the contact bumps and its contact members. The flip-chip's lower surface, or the board surface in a BOC configuration, is also generally flat. The contact bumps on the flip-chip are not usually a uniform size because of the imprecise solidifying characteristics of the conductive materials used in creating the contact bumps. For example, when the contact bump is originally liquified to attach to the flip-chip or BOC, it may solidify into a slightly different shape than any of the other contact bumps. Accordingly, since the contact bumps may not be of a uniform shape, it may not be possible to temporarily electrically connect each of them to the socket during a test sequence. Nevertheless, the bumps on the flip-chip are not reflowed to achieve a connection to the socket during testing, as this connection is only temporary and would lead to the loss of the contact bumps or at least their significant degradation. Furthermore, the process of reflowing contact bumps requires the addition of thermal energy to the coupled electrical components which can adversely affect not only the integrated circuit contained in the component, but also the test socket. Thus, the inability to achieve an electrical connection between all of the solder bumps and the socket prevents an accurate test from being conducted, and may lead to the discarding of an otherwise usable flip-chip.

Thus, it will be appreciated that there is a need in the technology for a system for providing a reliable electrical connection between a semiconductor device and a socket in a test environment. The present invention provides an apparatus and method for improving the number of temporary electrical connections between a semiconductor device and a test socket.

SUMMARY OF THE INVENTION

The invention improves the electrical connections that are made between a flip-chip or BOC and a socket during the testing phase of fabrication. The invention can increase manufacturing efficiency and quality control by enabling the testing of flip-chips or BOCs without regard to whether its contact bumps are co-planar or have varying heights or diameters. Rather than using a solid base upon which to attach the contact members, the invention employs a flexible membrane for their attachment to allow relative motion between the contact members. This relative motion, derived from the resiliency of the flexible membrane, allows the contact members on the flexible membrane to adapt to the height variations of the contact bumps so as to form an electrical connection, and thereby improve the probability of a successful test of the chip. These variations may be on the same chip or between multiple chips. The movement of the flexible membrane is permitted by its attachment to a housing with a recess. The recess is covered by the flexible membrane to form a chamber in the housing. The chamber is filled with a fluid material, herein defined as a liquid or gas, which may form a delta between the chamber pressure and ambient pressure at a steady state (i.e. pressurized), be sealed at ambient pressure at a steady state, or be open to ambient pressure during the test sequence. The contact members are electrically connected by way of electrical contacts to the test equipment to maintain the flexibility of the flexible membrane.

The fluid material within the chamber will create an upward force upon the lower surface of the flexible membrane. This upward force, which is coupled with the resiliency of the flexible membrane, may help each unconnected contact member rise up towards the appropriate contact bump when the other connected contact members are pushed down toward the chamber. This will occur when the pressure in the chamber is dynamically increased by a reduction in the volume of the chamber caused by the contacting contact members. The fluid will try to equalize the pressure between the chamber and ambient pressure by bulging out in other areas of the flexible membrane. This bulging out helps instigate contact between the unconnected contact members and contact bumps. In this way, all of the contact members are enabled to form electrical connections with the contact bumps on the flip-chip or BOC and to enable the test equipment to perform an accurate test.

BRIEF DESCRIPTION OF THE DRAWINGS

These and other features and advantages of the invention will become more apparent upon reading the following detailed description and upon reference to the accompanying drawings, in which.

DETAILED DESCRIPTION OF THE PREFERRED EMBODIMENTS

Figure 1:
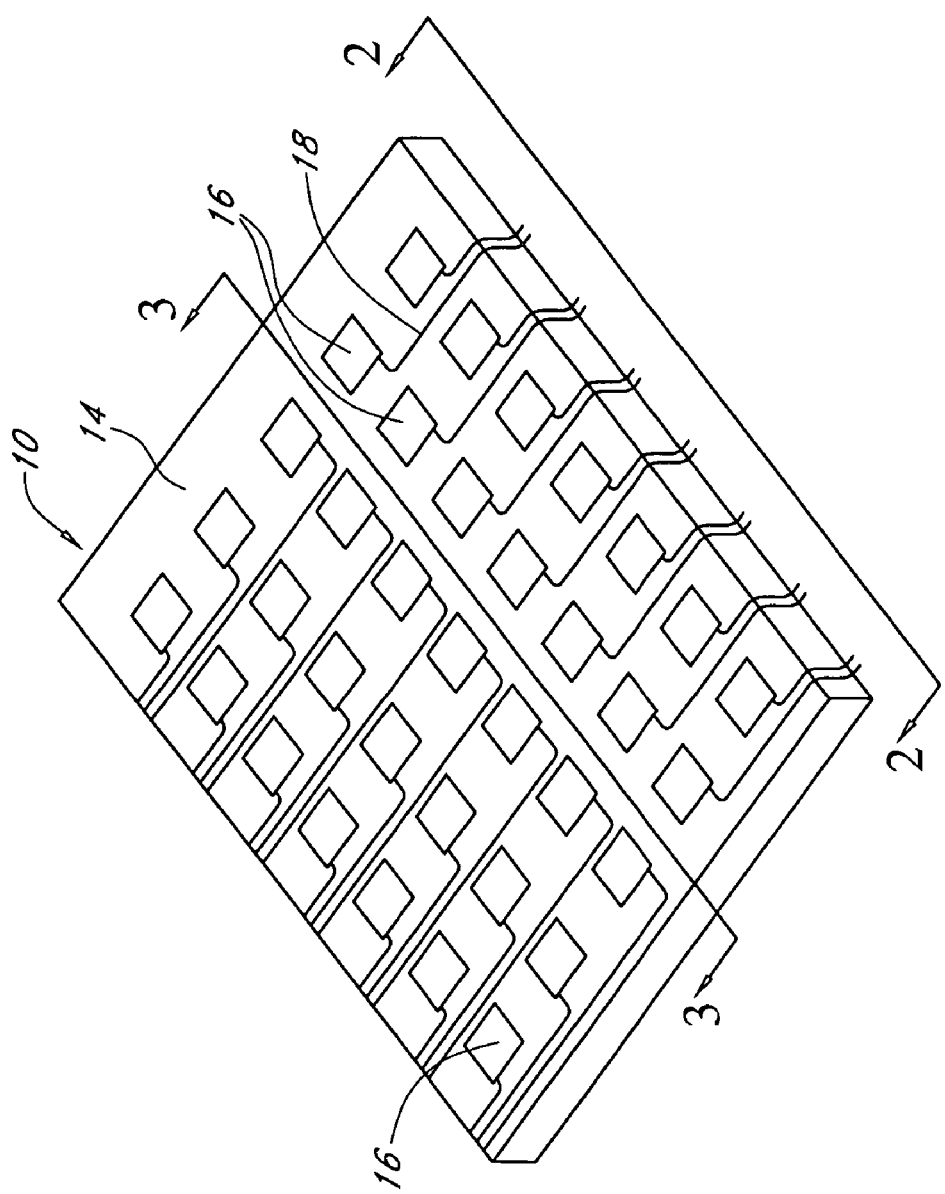
FIG. 1 is a perspective view of a socket of the invention having pads thereon configured in a conventional manner.

Broadly stated, FIG. 1 shows an overview of an embodiment of an adjustable membrane test device for a semiconductor. FIG. 1 is a perspective view of a socket 10 of a preferred embodiment of the invention. The socket 10 consists of a housing 12 with a recess (not shown) covered on at least one side with a flexible membrane 14 to form a chamber (not shown) in the housing 12. The housing 12 is rigidly designed to provide the support for the attached flexible membrane 14. The flexible membrane 14 is made from a non-conductive material and creates an adjustable surface.

A plurality of contact members 16 are attached to that surface of the flexible membrane 14 which faces the electrical device under test. The plurality of contact members 16 may take the form of individual planar surfaces such as those shown or, alternatively, concave surfaces, convex surfaces, linear protrusions such as piercing contacts, dendrite protrusions or other geometric structures configured to make individual electrical contact with the semiconductor device. As such, the plurality of contact members 16 are electrically conductive and configured to temporarily connect to contact bumps on a flip-chip, BOC, or other semiconductor device during a test sequence. The plurality of contact members 16 are further electrically connected, by way of a plurality of electrical connectors 18, to a testing device so as to maintain the flexibility of the flexible membrane 14.

The testing device may be a computer, resistor, or other device used for originating or processing of electrical signals. Although FIG. 1 illustrates the plurality of contact members 16 arranged in a two dimensional array for electrical connection with a BGA or other electrical device in the flip-chip or BOC configuration, it will be appreciated that the plurality of contact members 16 may be configured in any desired arrangement without adversely affecting the operation thereof.

Figure 2:
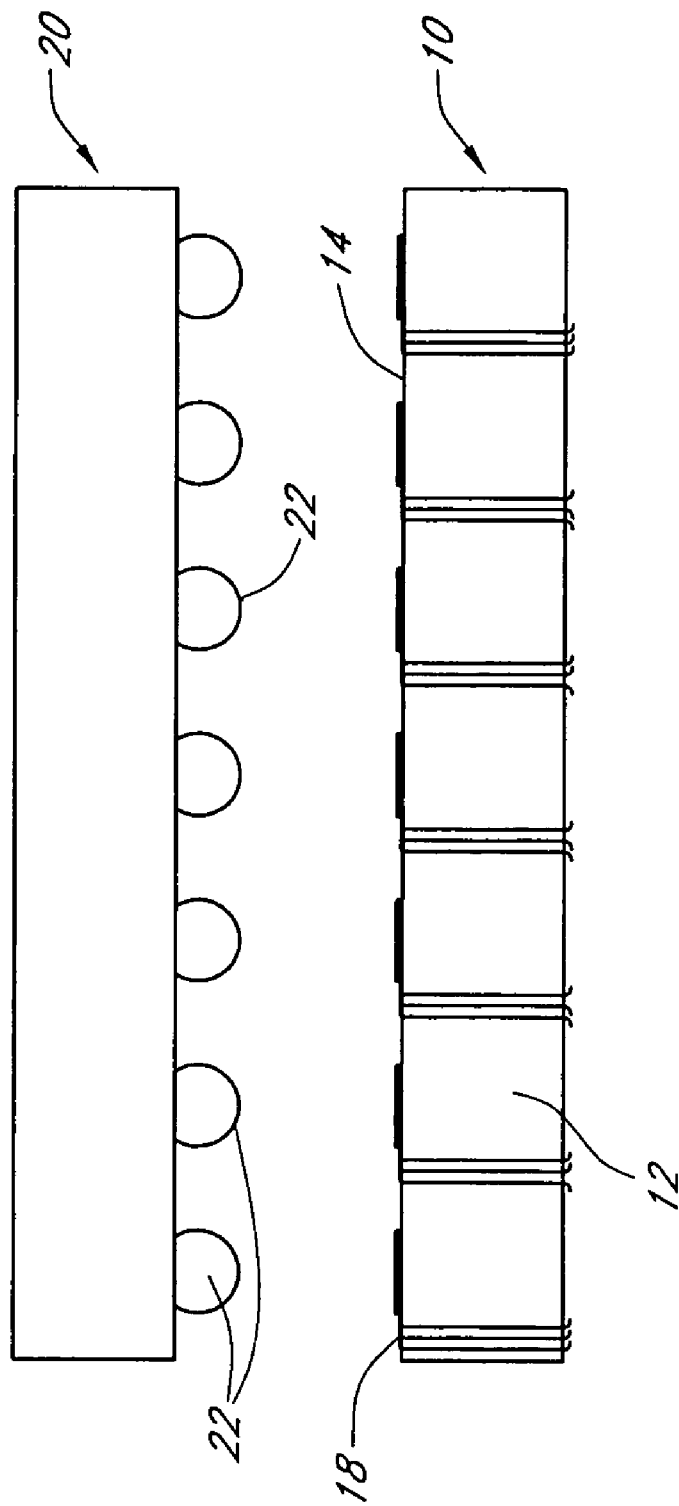
FIG. 2 is a side elevation view of the socket illustrated in FIG. 1, taken along lines 2—2 of FIG. 1, and illustrating a flip-chip positioned above the socket.

Referring now to FIG. 2, the mating surfaces on the flip-chip 20 and socket 10 can be described. Fixedly attached to the flip-chip 20 on its lower surface is a plurality of contact bumps 22, which are generally spherical, hemispherical, or dome shaped. The height of each of the plurality of contact bumps 22 often varies, thus causing a non-planar contact surface across the flip-chip 20. The plurality of contact bumps 22 are electrically connected to the I/O contacts, or contact pads, formed on the active circuit or front side thereof (not shown). The I/O contacts provide signal, power, and ground contacts for the flip-chip 20. The plurality of contact bumps 22 are used as electrical and mechanical connectors between the contact pads on the flip-chip 20 and a substrate such as a chip carrier, printed circuit board, or other surface mount device. The plurality of contact bumps 22 are made of materials that are electrically conductive and have special liquefying properties such as conductive polymers, conductive resins, and solder (e.g. alloys of lead and tin). The specific constituents of solder, if used, are dependent on the desired melting temperature, as well as the thermal characteristics of the mating surfaces.

As shown in FIG. 2, the flip-chip 20 is geometrically aligned with the socket 10 in preparation for a testing sequence. Geometrical alignment involves horizontally aligning the plurality of contact bumps 22 on the flip-chip 20 with the corresponding plurality of contact members 16 attached to the flexible membrane 14 on the socket 10.

Figure 3:
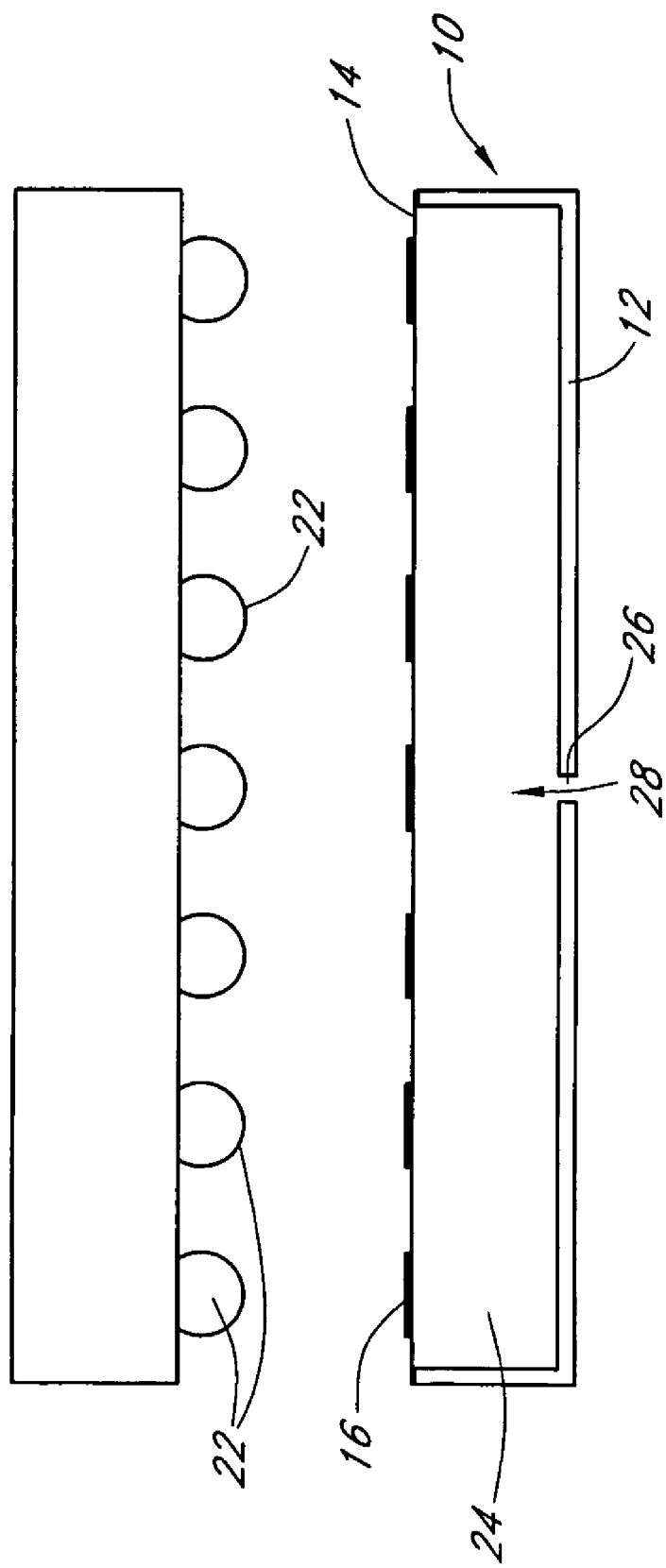
FIG. 3 is a cross-sectional view of the socket illustrated in FIG. 1, taken along lines 3—3 of FIG. 1, and illustrating a flip-chip positioned above the socket.

Upon inspection of FIG. 3, it is seen that the flexible membrane 14 completes the chamber 24 by covering the recess of the housing 12. The depth of the chamber 24 is configured so as to permit sufficient relative movement of the plurality of contact members 16 to accommodate the variations in height between the plurality of contact bumps 22. These variations, in the plurality of contact bump 22 heights, may be measured by any simple means commonly know in the art. As these variations may be small, only a small gap between the flexible membrane 14 and the four sides and bottom of the housing 12 may be required to form the chamber 24. It will be appreciated that the shape of the chamber 24 is not confined to the embodiment shown in FIG. 3.

The support for the flexible membrane 14 is provided around its periphery where it is attached to the four sidewalls of the housing 12. The four sidewalls form a frame around the recess in the housing 12. Alternately, the flexible membrane 14 may be attached to a lip formed around the edge of the housing 12. The attachment of the flexible membrane 14 may be achieved with the use of an adhesive, circumferential strap or band, or another method known in the art. In another embodiment, the four sidewalls of the housing 12 are tapered so as to allow a mating frame to snugly fit around the four sidewalls and the flexible membrane 14 to form a seal. In still another embodiment, the flexible membrane 14 is preformed whereby the flexible membrane 14 covers the recess in the housing 12 and downwardly extends across the four sidewalls until it forms a sealing lip over the bottom wall of the housing 12. In one preferred embodiment, the chamber 24 is sealed at the interface between the flexible membrane 14 and the four sidewalls of the housing 12. In other embodiments, where pressurization of the chamber is not required, the flexible membrane 14 does not form a seal with the housing 12.

As is also shown in FIG. 3, the flip-chip 20 is geometrically aligned with the socket 10 in preparation for its temporary connection to the socket 10 during a testing sequence. The flip-chip 20 must be placed in contact with the socket 10 so as to allow the plurality of contact bumps 22 to contact the plurality of contact members 16 before a test can occur. The flip-chip 20 may be lowered or the socket 10 raised so as to achieve contact. In the preferred embodiment, the chamber 24 is filled with a fluid material, herein defined as a liquid or gas such as air, which may form a delta between the chamber pressure and ambient pressure at a steady state (i.e. pressurized), be sealed at ambient pressure at a steady state, or be open to ambient pressure during the test sequence. The pressure of the fluid material contained within the chamber 24 is controlled by adding or removing fluid material through a pipe 26 configured as a conduit between the chamber 24 and a device or the ambient environment. FIG. 3 illustrates the location of the pipe 26 as extending from the bottom surface of the chamber 24 in the housing 12 and continuing through to the external surface of the housing 12 to thereby provide a conduit to the chamber 24. It will be appreciated that the location of the pipe 28 is not confined to the embodiment shown in FIG. 3, as multiple locations of the pipe 26 may be used without deviating from the scope of the invention.

The pressure of the fluid material may be increased by adding fluid material through the pipe 26 into the chamber 24 in the direction of an arrow 28. The pipe 26 may contain a releasable one-way valve (not shown) that prevents fluid from travelling in the opposite direction to the arrow 28 unless the valve is released, thereby allowing the fluid material's pressure to increase as more fluid material is added. Each pipe 26 may contain a fitting (not shown) that will allow an operator to attach a fluid material source such as an electric pump, hand-held pump, etc.

Figure 4:
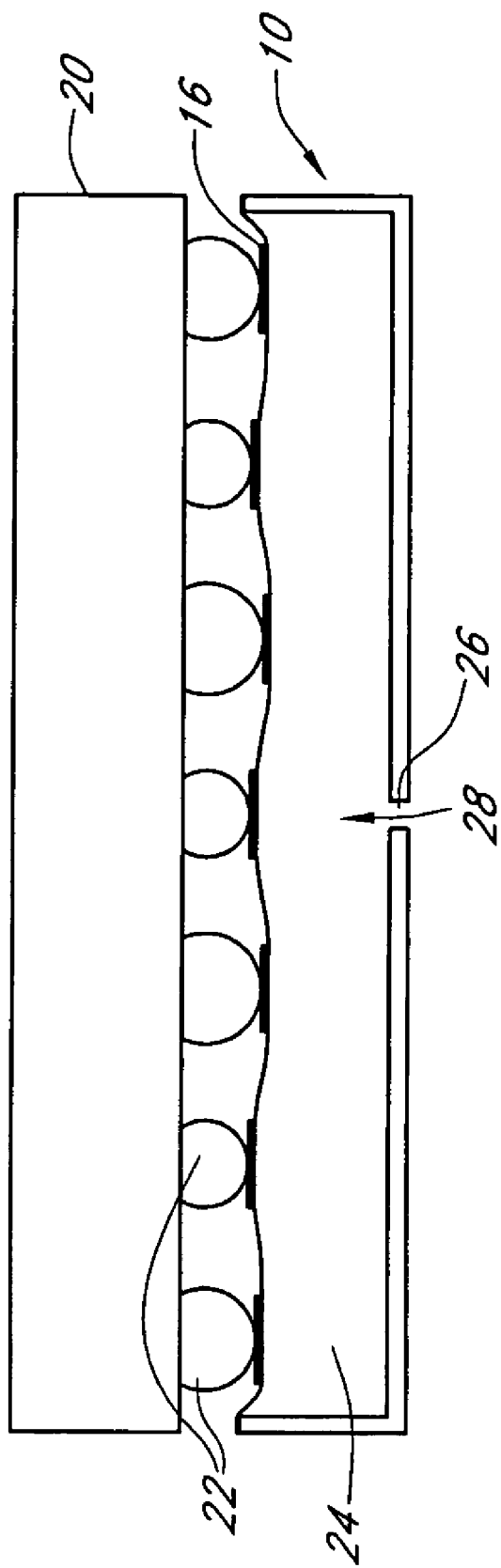
FIG. 4 is a cross-sectional view of the socket illustrated in FIG. 1 taken along lines 3—3 of FIG. 1, and illustrating a flip-chip positioned above the socket as occurs during a testing sequence.

The operation of the socket 10 may be understood by reference to FIG. 4 which shows the socket 10 adapting to the non-planar surface of the flip-chip 20 socket 10 during a testing sequence. As the flip-chip 20 is lowered, or socket 10 raised, at least one of the plurality of contact members 16 and at least one of the plurality of contact bumps 22 will come in contact with each other. Some of the plurality of contact bumps 22 and their associated contact members 16 will not form an electrical contact because of the non-uniform or non-planar shape of the plurality of contact bumps 22. These variations may be on the same chip or between multiple chips.

The flexible membrane 14, which permits the relative motion of each of the plurality of contact members 16, will allow additional contact bumps 22 to form an electrical connection with the contact members 16. As the flip-chip 20 continues to lower and contacts the socket 10, the fluid material within the chamber 24 will create an upward force upon the surface of the flexible membrane 14 opposite to the surface facing the device to be tested. This upward force, which is coupled with the resiliency of the flexible membrane 14, will help the unconnected contact members 16 rise up towards the appropriate contact bumps 22 when the other connected contact members 16 are pushed down toward the chamber 24. This will occur when the pressure in the chamber 24 is dynamically increased by a reduction in the volume of the chamber 24 caused by the contacting contact members 16 as they are pushed into housing 12. The fluid will try to equalize the pressure between the chamber 24 and ambient by bulging out in other areas of the flexible membrane 14. This bulging out may help instigate contact between the unconnected contact members 16 and the associated contact bumps 22, thus increasing the number of successful electrical connections between the plurality of contact members 16 and the plurality of contact bumps 22 on the flip-chip 20 or BOC, thereby improving the probability of a successful test of the chip 20. The bendable nature of the flexible membrane 14 along with such factors as, for example, the initial pressure of the fluid material in the chamber 24, whether the chamber 24 is sealed, and whether the fluid in the chamber 24 is compressible or incompressible, allows the plurality of contact members 16 to move relative to one another. Upon contact between the plurality of contact members 16 and the plurality of contact bumps 22, the electrical signals are then conducted by the electrical connections 18 to the electrical test equipment (not shown).

The pressure of the fluid material inside the chamber 24 may be adjustable so that an operator can increase or decrease the pressure when the operator wants to change the characteristics of the socket 10. In one embodiment, the pressure in the chamber 24 may be increased prior to contact between the flip-chip 20 and the socket 10. In this or another embodiment, once an electrical connection is made between some of the plurality of contact members 16 and the associated plurality of contact bumps 22, the pressure may then be increased to move the unconnected plurality of contact members 16 towards the unconnected plurality of contact bumps 22. It may not be desirable to keep the pressure in the chamber 24 at a high level unless the particular test sequence requires it to be at a high level. Thus, after its use in a test, the operator may then desire to open a release valve which is in flow communication with the pipe 26 to lower the pressure of the fluid material back down to a nominal or selected pressure. Alternatively, when initially positioning the flip-chip 20 and socket 10, the user may choose to lower the flip-chip 20 further towards the socket 10 rather than increasing the pressure of the fluid material. It may also be desirable to include guards (not shown) which prevent the flip-chip 20, or BOC, from being lowered too far down toward the socket 10, and thereby accidentally tearing the flexible membrane 14 or destroying its seal with the housing 12.

Figure 5:
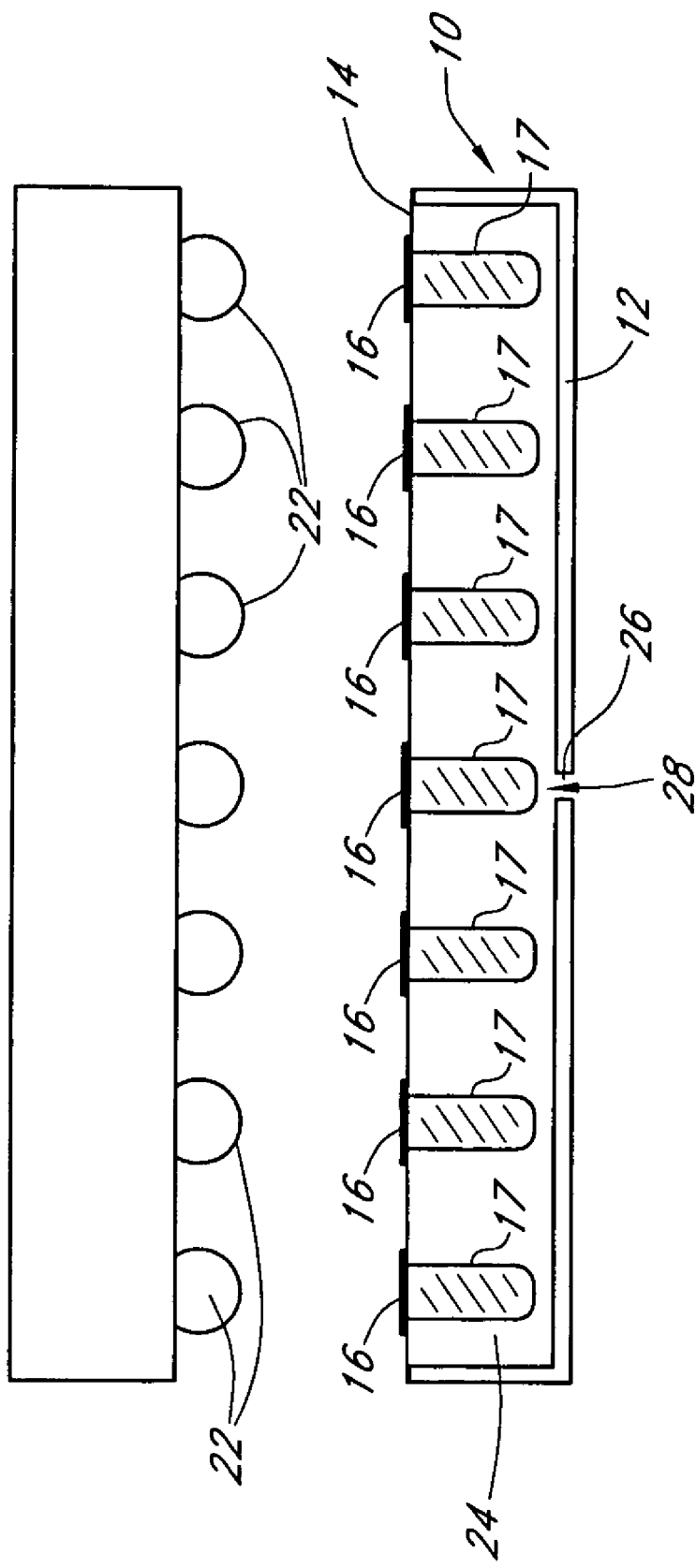
FIG. 5 is a cross-sectional view of another embodiment of the socket illustrated in FIG. 1, taken along lines 3—3 of FIG. 1, and illustrating a flip-chip positioned above the socket.

FIG. 5 illustrates another embodiment of the socket 10. This embodiment is substantially the same as the socket 10 of FIG. 3, except that several elastomer members 17 have been added. The elastomer members 17 are attached to the lower portion of each of the contract members 16 so as to each extend downward in substantially vertical direction from the associated contact member 16. Each of the elastomer members 17 extend at least partially across the chamber 24.

Figure 6:
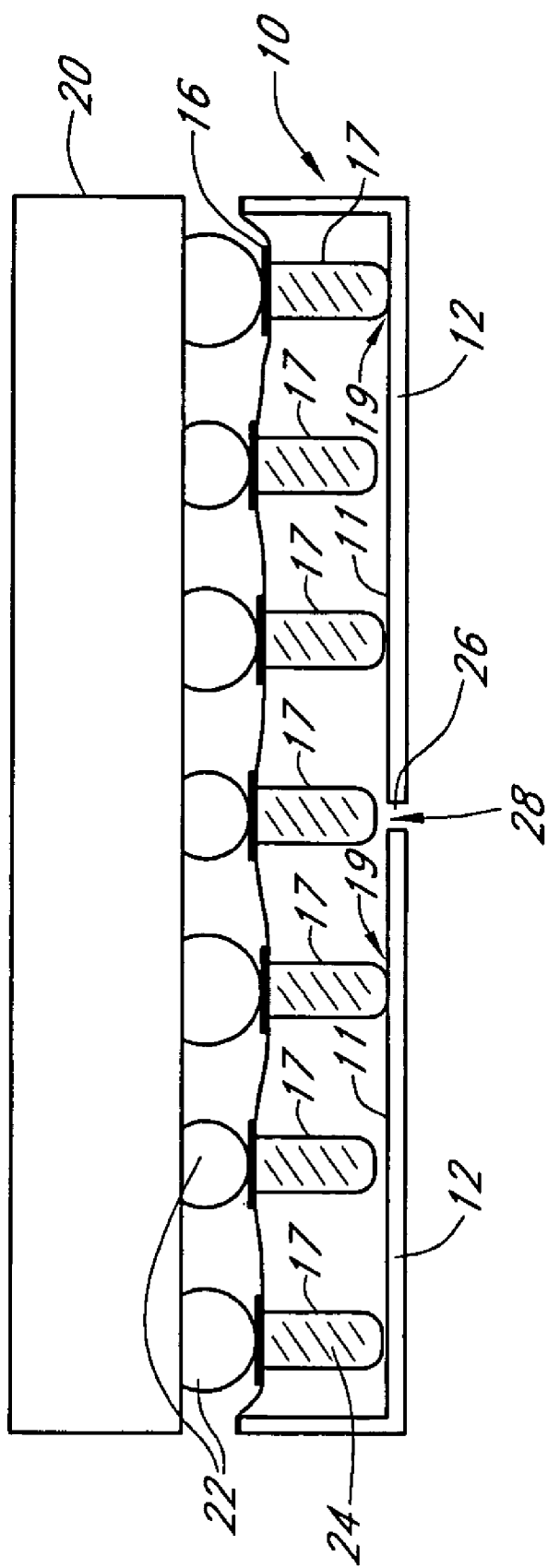
FIG. 6 is a cross-sectional view of another embodiment of the socket illustrated in FIG. 1 taken along lines 3—3 of FIG. 1, and illustrating a flip-chip positioned above the socket as occurs during a testing sequence.

By reference to FIG. 6, it is seen that when the larger contact bumps 22 press downward on the contact members 16, those contact members 16 which are displaced by the larger contact bumps 22 move downward across the chamber 24. As the larger contact bumps 22 attempt to continue their downward travel, their associated elastomer members 17 contact an upper surface 11 of the base of the housing 12, such as is shown at 19. This surface 11 prevents further downward travel of the elastomer members 17 and their associated contact bumps 22 and provides support therefor. This prevents undesirably large travel distances for the flexible membrane 14 while still providing some compressibility so that contact between the other contact bumps 22 and their associated contact members 16 can occur. Thus, the embodiment of FIGS. 5 and 6 prevents the possible tearing of the flexible membrane 14, and destruction of the seal within the housing 12.

Figure 7:
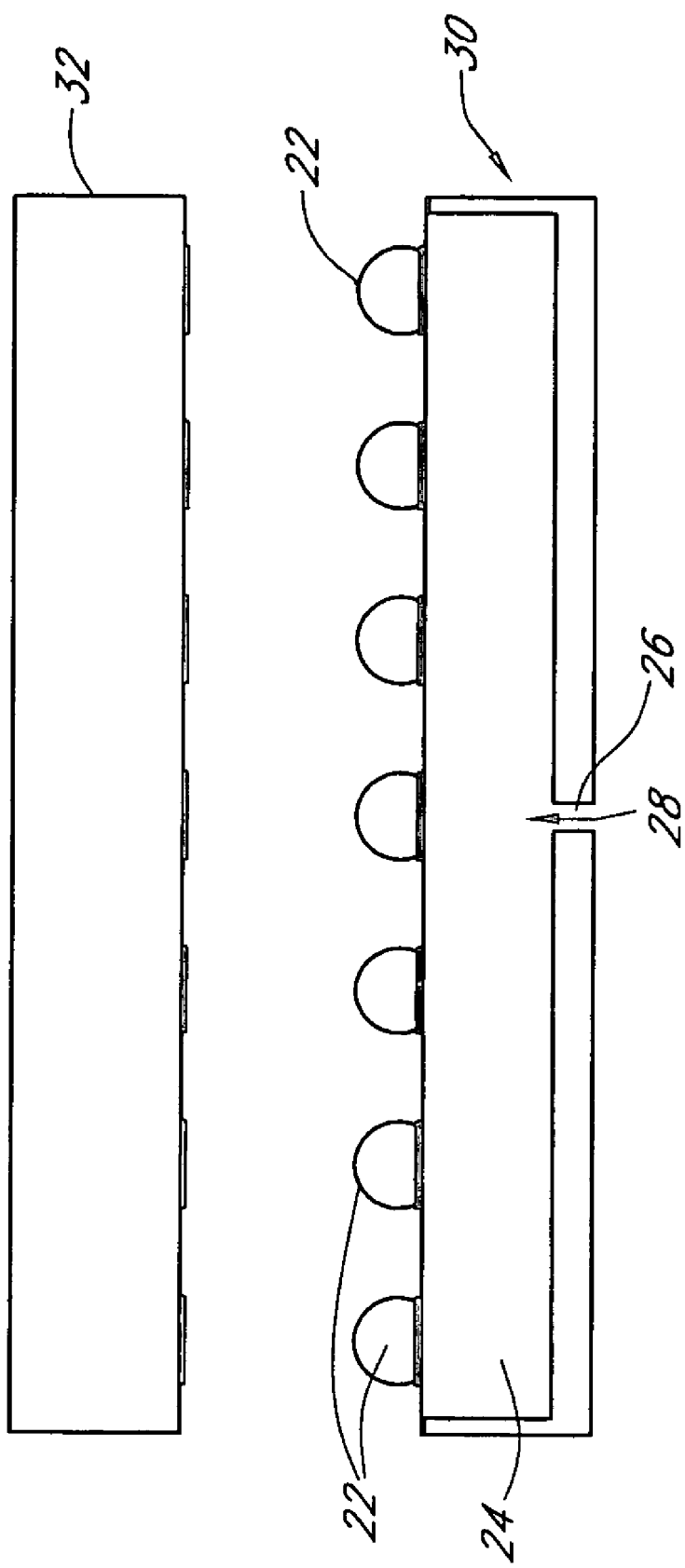
FIG. 7 is a cross-sectional view of an alternative embodiment of a socket of the invention with a flip-chip located above the socket.

Referring now to FIG. 7, an embodiment of a bumped socket 32 is shown which is substantially like that of FIG. 3. The two differ primarily on which of the mating surfaces includes the plurality of contact bumps 22. A bumped socket 30 is shown with a device to be tested 32, for example a non-bumped semiconductor chip 32 located above the bumped socket 30. In this embodiment, the plurality of contact bumps 22 are attached to the plurality of contact members 16 on the bumped socket 30, rather than on the device to be tested 32. This configuration is operated in substantially the same manner as the embodiment described in FIG. 4. When the device to be tested 32 is lowered onto the bumped socket 30, the flexible membrane 14 and pressure of the fluid material in the chamber 24 will allow the plurality of contact bumps 22 and the attached plurality of contact members 16 to raise or lower depending on their relative differences in height. The other components will function in a similar manner to the embodiment described in FIG. 4. This embodiment may allow a test to be conducted on a flip-chip, BOC, or other electrical device that does not have contact bumps 22 attached.

Figure 8:
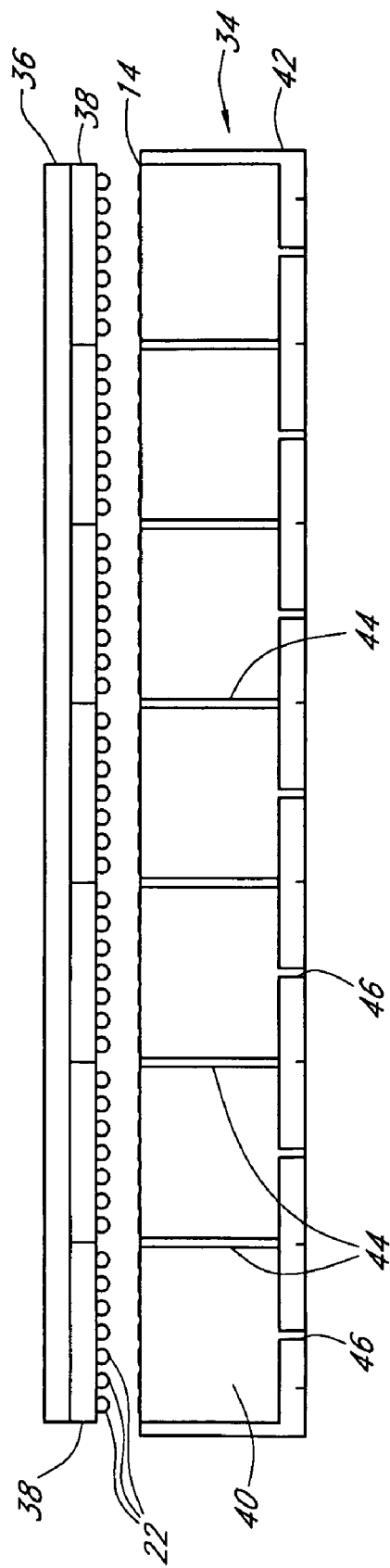
FIG. 8 is a cross-sectional view of an alternative embodiment of the socket of the invention with a wafer in a BOC configuration positioned above the socket.

FIG. 8 is a cross-sectional view of another embodiment of the invention which allows the simultaneous testing of multiple semiconductor devices. An extended socket 34, with a semiconductor wafer 36 in a BOC configuration positioned above the extended socket 34, is shown. A semiconductor wafer is comprised of a plurality of semiconductor devices (not shown) prior to the devices being singulated from the wafer. This embodiment displays the extended socket 34 as configured to test an array of devices, for example, the semiconductor wafer 36, which is shown mounted in a BOC configuration in which each individual semiconductor device on the semiconductor wafer 36 is mounted to a substrate 38, such as a chip carrier, printed circuit board, or other surface mount device. In contrast to a flip-chip, the inactive circuit or backside of the semiconductor wafer 36 is attached to the substrate 38. The exposed contact pads (not shown) on the side away from the substrate 38 are subsequently connected to the substrate 38 with the use of curved wire bonds (not shown). A glob top protective resin (not shown) is subsequently applied over each individual semiconductor device and the wire bonds.

FIG. 8 further shows the plurality of contact bumps 22 attached to the surface of the substrate 38 facing the contact members 16 on the flexible membrane 14 of the extended socket 34. In this embodiment, there are a plurality of chambers 40 in a housing 42, each of which are separated from the others by a grid of walls 44. To create the plurality of chambers 40, the flexible membrane 14 is attached to the upper surface of the grid of walls 44 and the four sidewalls of the housing 42. In this embodiment, the flexible membrane 14 covers the plurality of chambers 40. Alternately, the flexible membrane 14 may consist of a plurality of smaller flexible membranes (not shown) with each covering a portion of the grid of walls 44. The lower surface of each of the plurality of chambers 40 is created by the bottom surface of the housing 42.

The plurality of chambers 40 have individually controlled fluid material pressures with each being fed individually by a pipe 46 that extends through the housing 42 so as to form a conduit between the associated chamber 40 and the ambient environment. Alternatively, the plurality of chambers 40 may be fed from the same pipe 46. Numerous other piping methods and designs known in the art may be employed to pump fluid into the plurality of chambers 40. Of course, it will be appreciated that the flip-chip configuration can be readily substituted for the BOC configuration in this embodiment, such that the contact bumps on the flip-chip are aligned with the contact members 16 in the manner illustrated in FIG. 6.

Figure 9:
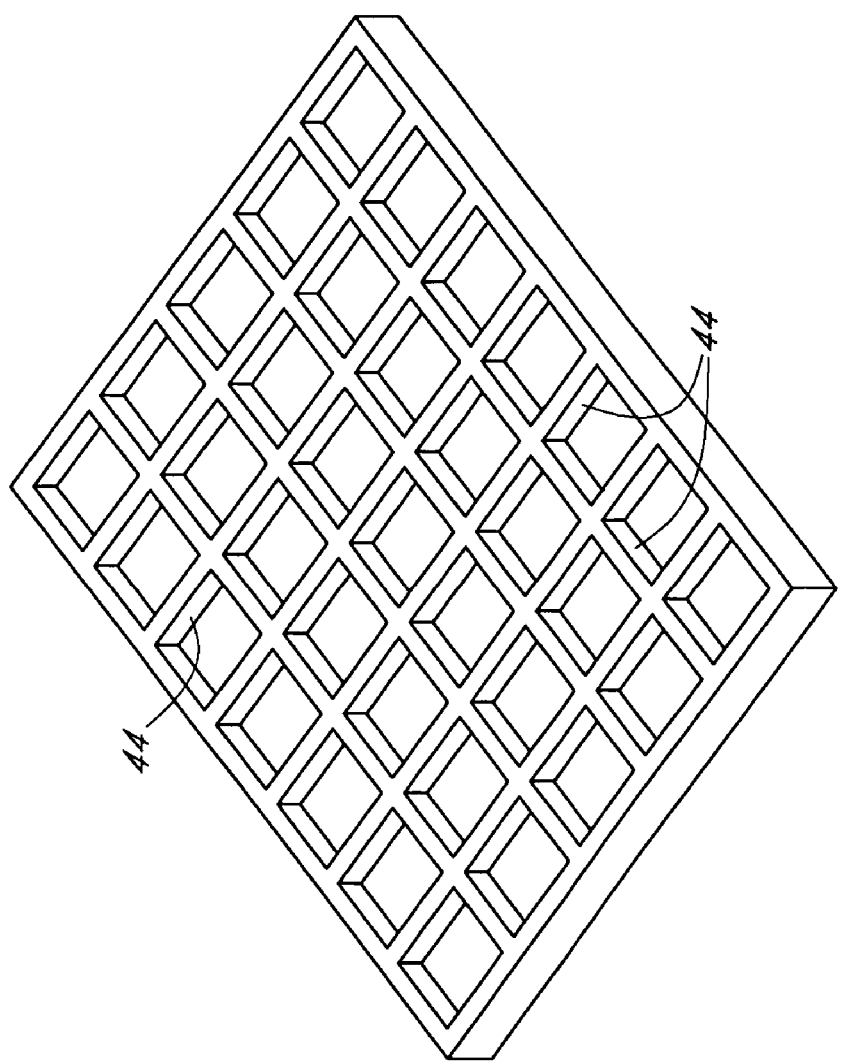
FIG. 9 is a perspective view of a grid used in one embodiment of the invention.

FIG. 9 is a perspective view of the grid of walls 44 used in one embodiment of the invention described in FIG. 8. The grid of walls 44 forms the lateral walls of each of the plurality of chambers 40 in the embodiment shown in FIG. 8. Alternatively, the grid of walls 44 may be manufactured as part of the housing 42 rather than being a separate object.

Figure 10:
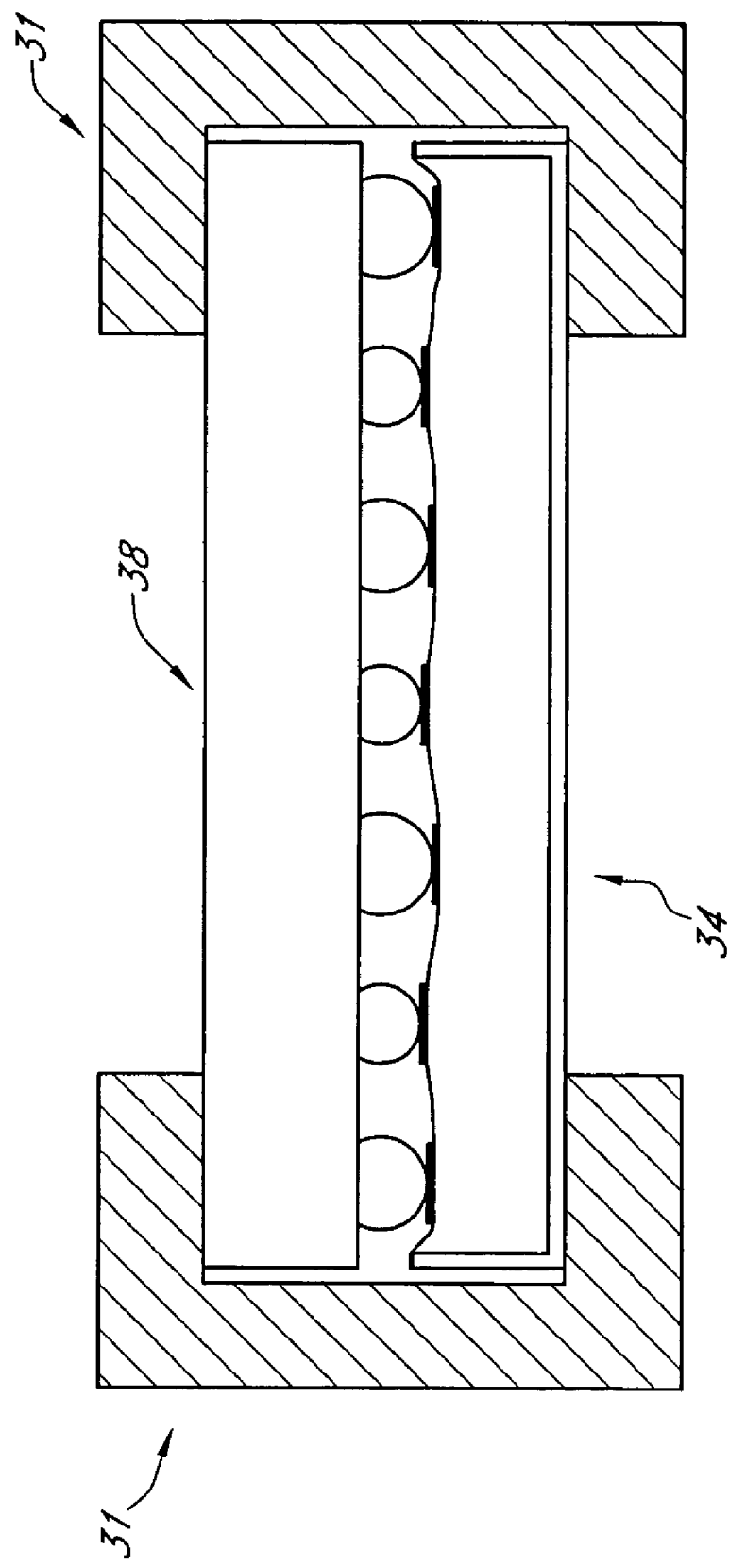
FIG. 10 is a cross-sectional view of a socket of the invention secured in contact with a flip-chip by a cartridge.

The embodiment illustrated in FIG. 8 may be used for the testing of an entire semiconductor wafer such as wafer level packages including flip-chip or selected groups of semiconductor devices in the wafer depending on such factors as, for example, the density of the semiconductor devices, the number of contact members 16, and the availability of electrical connectors 18 or test equipment to process the test data. The plurality of chambers 40 associated with the semiconductor devices to be tested could be selectively pressurized. This entire semiconductor wafer level testing can also be employed for wafer level burn-in (WLBI). Here the entire wafer and socketing assembly are placed in a cartridge, such as that illustrated at 31 in FIG. 10, whose temperature can be controlled. Burn-in is typically done at 125° C. to 150° C. and so the wafer is subjected to these temperatures while secured in position within the cartridge 31.

If desired, the illustrated clam shell configuration of the cartridge 31 permits application of pressure across the entire surface of the substrate 38 and socket 34. Although two securing members such as clamps are shown defining the cartridge 31, it will be appreciated that additional ones of these can be added to secure additional portions of the substrate 38 and socket 34 together. It will also be appreciated that the cartridge 31 can comprise a single member surrounding and sandwiching the substrate 38 and socket 34 together Operation of the test procedure in accordance with one embodiment of the invention can be described with reference to FIG. 1. In particular, flow begins in start block 46. Flow proceeds to block 48 where the chamber inside the housing is filled with a fluid. Flow continues to block 50 where the device to be tested is lowered onto flexible membrane covering the housing. Continuing to block 52, where as some contact bumps contact the flexible surface and force the surface into the chamber, the resiliency of the flexible membrane coupled with the chamber pressure facilitates contact with the unconnected contact bumps. Flow proceeds to block 54 where the test on the device is performed. Finally, in block 56, the device is removed from the test apparatus.

Figure 11:
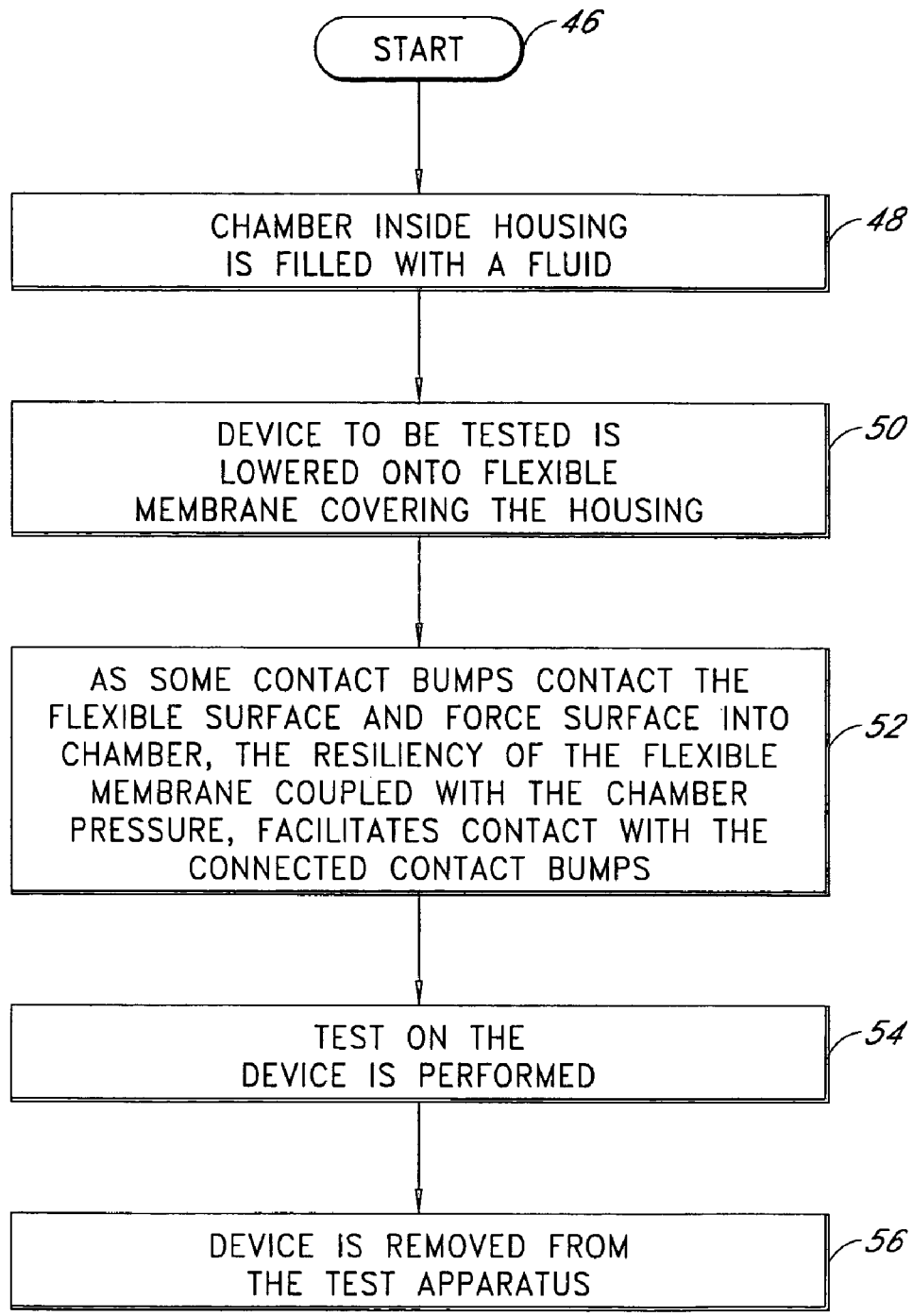
FIG. 11 is a flow chart illustrating the test process in accordance with the invention.
Figure 12:
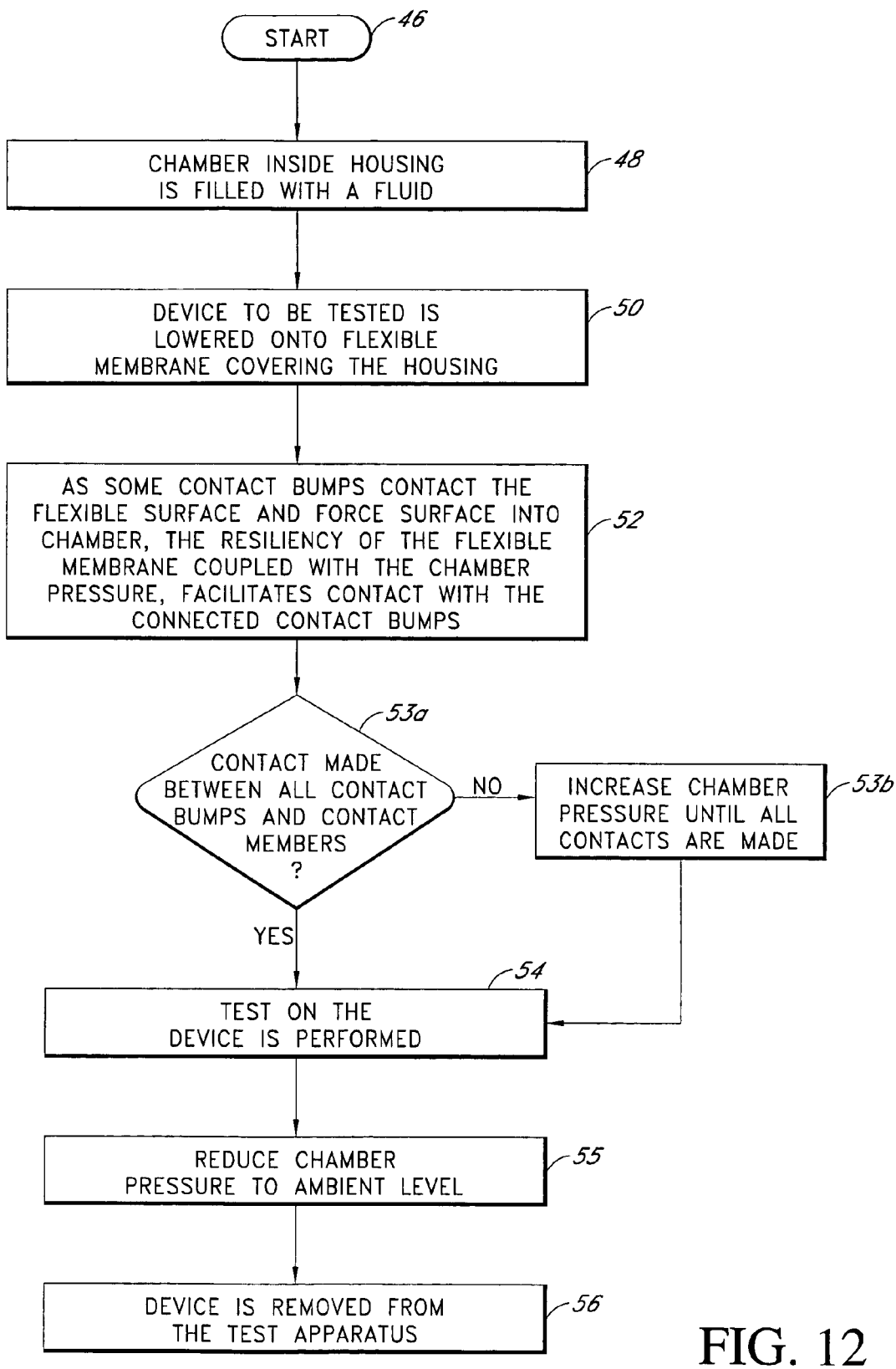
FIG. 12 is a flow chart illustrating another embodiment of the test process in accordance with the invention.

FIG. 12 illustrates an alternate embodiment of the method of FIG. 11. The embodiment of FIG. 12 is substantially the same as the embodiment of FIG. 11, except that after completion of the acts of block 52, the method moves to a block 53A wherein it is determined if contact has been achieved between all contact bumps and the flexible surface. If such complete contact has not been achieved, the method moves to a block 53B wherein pressure in the chamber is increased to bring the remaining contact bumps into contact with the flexible surface. From block 53B, or from block 53A if all contacts have been made, the method proceeds to block 54 and functions as defined with reference to FIG. 11. After completion of the acts of block 54, the method moves to a block 55 wherein pressure in the chamber is reduced to ambient. Following completion of the acts of block 55, the method moves to block 56 and functions as described previously with reference to FIG. 11.

Numerous variations and modifications of the invention will become readily apparent to those skilled in the art. Accordingly, the invention may be embodied in other specific forms without departing from its spirit or essential characteristics. The detailed embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

I claim:

1. A device for testing a plurality of semiconductor devices, the plurality of semiconductor devices forming a wafer having a plurality of electrical contacts on a first side, and the plurality of electrical contacts comprising substantially every electrical contact on the first side of the wafer, the testing device comprising:
    a housing;
    a grid comprising a plurality of connected frames within the housing;
    at least one flexible membrane attached to the grid and extending over a plurality of the connected frames to form a plurality of chambers;
    a plurality of contact members positioned on the at least one flexible membrane and configured to provide electrical connections to each of the plurality of electrical contacts; and
    at least one fluid channel connecting at least one of the chambers to a fluid source outside the housing to allow a fluid to flow into at least one of the chambers.

2. The device of claim 1, wherein the at least one flexible membrane comprises a plurality of flexible membranes.

3. The device of claim 1, wherein the plurality of semiconductor devices comprise an integrated circuit board on chip configuration.

4. The device of claim 1, wherein the fluid comprises a gas.

5. The device of claim 4, wherein the fluid comprises air.

6. The device of claim 1, wherein the fluid comprises a liquid.

7. The device of claim 1, wherein the fluid source comprises a pump.

8. The device of claim 7, wherein the fluid source comprises an electric pump.

9. The device of claim 1, further comprising at least one passage between at least two of the chambers allowing the fluid to flow between the at least two chambers.

10. The device of claim 1, further comprising at least one stop connected to the at least one flexible membrane to restrict the at least one flexible membrane from recessing beyond a predefined level.

11. The device of claim 10, wherein the stop comprises a plurality of deformable members connected to the plurality of contact members and extending within at least one of the chambers to contact a portion of the housing when the plurality of contact members are moved toward a bottom of the at least one chamber a distance that exceeds the predefined level.

12. The testing-device of claim 11, wherein the plurality of deformable members comprises a plurality of elastomer members having a height of less than a depth of the at least one chamber.

13. The device of claim 1, wherein the plurality of contact members are bumps.

14. The device of claim 1, wherein the plurality of contact members are configured to define a plurality of piercing contacts.

15. A system for testing electrical components, comprising:
    the testing device of claim 1; and
    a plurality of semiconductor devices forming a wafer having a plurality of electrical contacts on a first side, the plurality of electrical contacts comprising substantially every electrical contact on the first side of the wafer.

16. The system of claim 15, wherein the plurality of electrical contacts are bumps.

* * * * *

UNITED STATES PATENT AND TRADEMARK OFFICE
CERTIFICATE OF CORRECTION

PATENT NO.       : 7,141,994 B2                                        Page 1 of 1
APPLICATION NO.  : 10/766371
DATED            : November 28, 2006
INVENTOR(S)      : Akram It is certified that error appears in the above-identified patent and that said Letters Patent is hereby corrected as shown below:

At column 9, line 6, please delete "FIG. 1" and insert -- FIG. 11 --

In Claim 12, at column 10, line 37, please delete "testing-device" and insert -- device --

Signed and Sealed this

Twenty-fourth Day of April, 2007

JON W. DUDAS
*Director of the United States Patent and Trademark Office*